United States Patent [19]

Currie et al.

[11] 4,394,642
[45] Jul. 19, 1983

[54] APPARATUS FOR INTERLEAVING AND DE-INTERLEAVING DATA

[75] Inventors: Robert J. Currie; Glen D. Rattlingourd, both of Salt Lake City; Billie M. Spencer, Bountiful; John W. Zscheile, Jr., Farmington, all of Utah

[73] Assignee: Sperry Corporation, New York, N.Y.

[21] Appl. No.: 304,434

[22] Filed: Sep. 21, 1981

[51] Int. Cl.³ .................................... H03K 13/24
[52] U.S. Cl. ........................... 340/347 DD; 371/40
[58] Field of Search ............ 340/347 DD; 371/40; 364/200, 900

[56] References Cited
U.S. PATENT DOCUMENTS
4,281,355 7/1981 Wada .................................... 371/40

OTHER PUBLICATIONS
Richer, "IEEE Transactions on Communications", vol. COM-26, No. 3, Mar. 1978, pp. 406-408.

Primary Examiner—C. D. Miller
Attorney, Agent, or Firm—John B. Sowell; Kenneth T. Grace; Marshall M. Truex

[57] ABSTRACT

A novel interleaver-de-interleaver is provided which is adapted to store bits of a data stream after being error encoded. The data bits are stored in a random access memory in addresses identifiable by an array of columns and rows. The interleaver comprises address pointer means and logic for reading the data bits out of the memory addresses in a predetermined reordered sequence to provide a quasi-random pattern sequence of data bits which when transmitted are substantially immune to periodic bursts of radio frequency interference signals.

11 Claims, 10 Drawing Figures

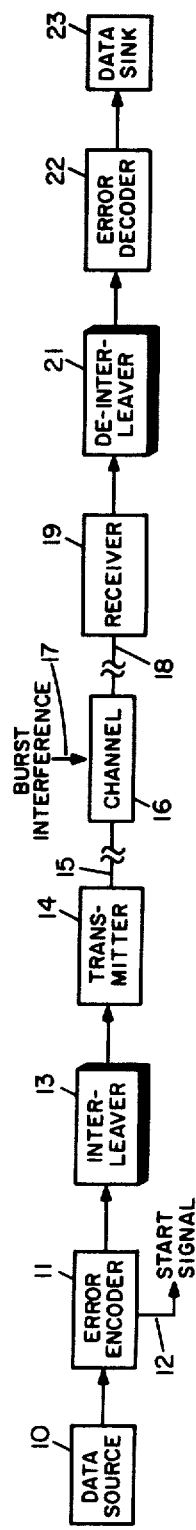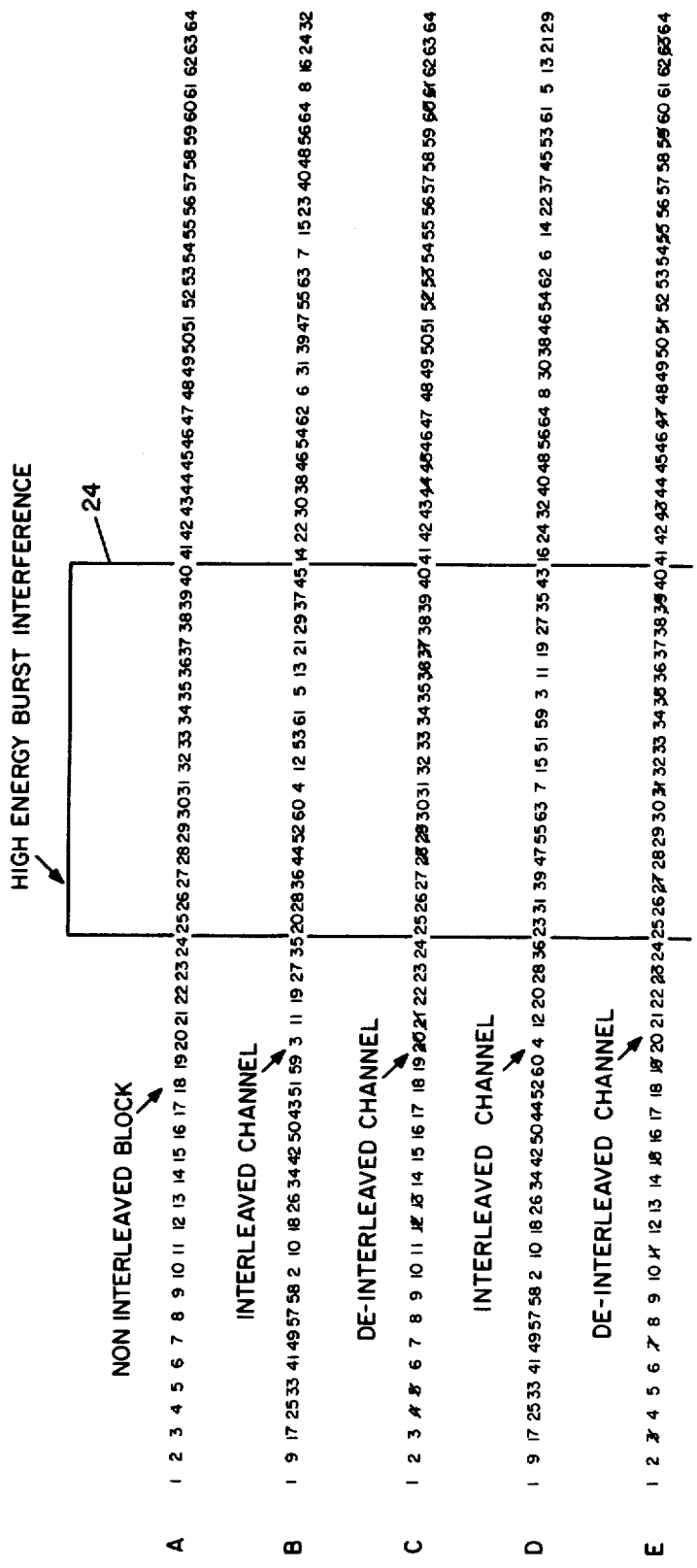

FIGURE 6A

| ROW \ COLUMNS | 0 | 1 | 2 | 3 | 4 | 5 | 6 | 7 |
|---|---|---|---|---|---|---|---|---|
| 0 | 1 | 2 | 4 | 7 | 3 | 8 | 6 | 5 |
| 1 | 9 | 10 | 12 | 15 | 11 | 16 | 14 | 13 |
| 2 | 17 | 18 | 20 | 23 | 19 | 24 | 22 | 21 |
| 3 | 25 | 26 | 28 | 31 | 27 | 32 | 30 | 29 |
| 4 | 33 | 34 | 36 | 39 | 35 | 40 | 38 | 37 |
| 5 | 41 | 42 | 44 | 47 | 43 | 48 | 46 | 45 |
| 6 | 49 | 50 | 52 | 55 | 51 | 56 | 54 | 53 |
| 7 | 57 | 58 | 60 | 63 | 59 | 64 | 62 | 61 |

FIGURE 6B

| ROW \ COLUMNS | 0 | 1 | 2 | 3 | 4 | 5 | 6 | 7 |
|---|---|---|---|---|---|---|---|---|
| 0 | 1 | 58 | 44 | 23 | 51 | 16 | 30 | 37 |
| 1 | 9 | 2 | 52 | 31 | 59 | 24 | 38 | 45 |
| 2 | 17 | 10 | 60 | 39 | 3 | 32 | 46 | 53 |
| 3 | 25 | 18 | 4 | 47 | 11 | 40 | 54 | 61 |
| 4 | 33 | 26 | 12 | 55 | 19 | 48 | 62 | 5 |
| 5 | 41 | 34 | 20 | 63 | 27 | 56 | 6 | 13 |
| 6 | 49 | 42 | 28 | 7 | 35 | 64 | 14 | 21 |
| 7 | 57 | 50 | 36 | 15 | 43 | 8 | 22 | 29 |

FIGURE 7A

| ROW \ COLUMNS | 0 | 1 | 2 | 3 | 4 | 5 | 6 | 7 |
|---|---|---|---|---|---|---|---|---|
| 0 | 1 | 10 | 27 | 52 | 21 | 62 | 47 | 64 |
| 1 | 9 | 18 | 35 | 60 | 29 | 6 | 55 | 8 |
| 2 | 17 | 26 | 43 | 4 | 37 | 14 | 63 | 16 |
| 3 | 25 | 34 | 51 | 12 | 45 | 22 | 7 | 24 |
| 4 | 33 | 42 | 59 | 20 | 53 | 30 | 15 | 32 |
| 5 | 41 | 50 | 3 | 28 | 61 | 38 | 23 | 40 |
| 6 | 49 | 58 | 11 | 36 | 5 | 46 | 31 | 48 |
| 7 | 57 | 2 | 19 | 44 | 13 | 54 | 39 | 56 |

FIGURE 7B

| ROW \ COLUMNS | 0 | 1 | 2 | 3 | 4 | 5 | 6 | 7 |
|---|---|---|---|---|---|---|---|---|
| 0 | 1 | 10 | 27 | 52 | 21 | 62 | 47 | 64 |
| 1 | 8 | 9 | 18 | 35 | 60 | 29 | 6 | 55 |
| 2 | 14 | 63 | 16 | 17 | 26 | 43 | 4 | 37 |
| 3 | 51 | 12 | 45 | 22 | 7 | 24 | 25 | 34 |
| 4 | 15 | 32 | 33 | 42 | 59 | 20 | 53 | 30 |
| 5 | 50 | 3 | 28 | 61 | 38 | 23 | 40 | 41 |
| 6 | 36 | 5 | 46 | 31 | 48 | 49 | 58 | 11 |
| 7 | 13 | 54 | 39 | 56 | 52 | 2 | 19 | 44 |

APPARATUS FOR INTERLEAVING AND DE-INTERLEAVING DATA

BACKGROUND OF THE INVENTION

1. Field of the Invention

This invention relates to apparatus for interleaving transmitted data. More particularly, the present invention discloses novel apparatus for interleaving and de-interleaving digital data that effectively randomizes channel burst interference.

2. Description of the Prior Art

Radio frequency waveforms employed to transmit communication data have been jammed or interfered with by radio frequency interference (RFI) signals. It is well known that high energy burst of RFI signals or periodic pulsed RFI signals can be made so strong as to completely mask transmitted communication data signals.

It is also well known that interleaving and de-interleaving apparatus can be employed to improve the performance of the transmitted data signals in the presence of burst of RFI signals. When the transmitted data is interleaved, the bits of data may be so distributed over a time period that the RFI signals do not mask or block sequential bits of the original data stream. When the interleaved data bits are de-interleaved at the receiving station, the receive blocks of data appear to have randomized bit errors rather than having broad ommissions of data where burst of RFI signals have occurred. The receive blocks of data bits with bit errors may be corrected by employing a proper type of error correction encoder and decoder that will correct the bit errors.

Row-column interleavers are known where a series stream of data bits are recorded sequentially in a memory array as horizontal rows of data bits. When the data bits are read out of the memory array, they are read out as vertical columns of data bits which effectively reorders the sequence of the series stream of data bits. Convolution interleavers are also known in which a data stream is effectively stored in a shift register and selected bits from different bit positions are read out of the shift register to reorder the stream of data bits. Row-column interleavers and also convolution interleavers are not as effective against periodic burst of RFI signals as would be desired.

Ira Richer has described a block interleaver in the March, 1978, IEEE Transactions on Communications, Vol. 26, No. 3. The described block interleaver effectively takes the block of data bits in a series stream and changes the original serial positions to a predetermined series of new positions similar to the afore-mentioned convolution interleaver. While this block interleaver is described as providing a linear congruential sequence of data bits which perform well in a useful range of periodic RFI duty cycles and repetitive rates it too leaves much to be desired.

It would be desirable to provide an improved or optimized interleaver and de-interleaver for use in a transmitting system subject to periodic burst of RFI timing signals which is effective over an unrestricted range of periodic RFI repetitive rates and jamming duty cycles up to twenty-five percent.

SUMMARY OF THE INVENTION

It is the principal object of the present invention to provide a novel and improved interleaver and de-interleaver for a data transmission system which is subject to radio frequency interference (RFI) signals.

It is another principal object of the present invention to provide a novel row-column interleaver and de-interleaver for use in a data transmission system subject to RFI jamming signals which may be effective over an unrestricted range of RFI repetitive rates and extended duty cycles.

It is another object of the present invention to provide an improved interleaver and de-interleaver which is easy to implement with commercially available components.

It is another object of the present invention to provide an improved interleaver and de-interleaver which may be implemented in hardware or software form.

It is yet another object of the present invention to provide a novel row-column interleaver and de-interleaver having a new and novel permutation for reordering data bits in columns or rows and for reordering columns or rows of data bits in an array of columns and rows.

It is a general object of the present invention to provide a predetermined permutation for reordering and rotating bits and columns and rows.

It is a further object of the present invention to provide a novel on-line interleaving and de-interleaving apparatus which optimizes the delay of the original data stream being recorded.

According to these and other objects of the present invention to be explained in greater detail hereinafter, there is provided an interleaving apparatus intermediate an encoded original data stream and a transmitter. The interleaver is adapted to store the bits of the data stream in a memory comprising a plurality of memory address positions arranged as an array of columns and rows. The interleaver comprises address pointer means for reading the data out of the address positions in a reordered sequence to provide a predetermined quasi-random pattern sequence of data bits which are substantially immune to periodic burst of radio frequency interference signals.

BRIEF DESCRIPTION OF THE DRAWINGS

FIG. 1 is a block diagram illustrating a typical environmental application of the present invention interleaver and de-interleaver;

FIG. 2 is a schematic diagram showing a block of 64 data bits before and after being subject to a high energy burst of radio frequency interference signals;

FIGS. 6A and 6B are schematic tables of an 8×8 memory array showing the position of the address bits during and after dual orthogonal permutation;

FIGS. 7A and 7B are schematic tables of an 8×8 memory array showing the position of the address bits during and after another form of dual orthogonal permutation.

DESCRIPTION OF THE PREFERRED EMBODIMENT

Figures 3, 4, 5:
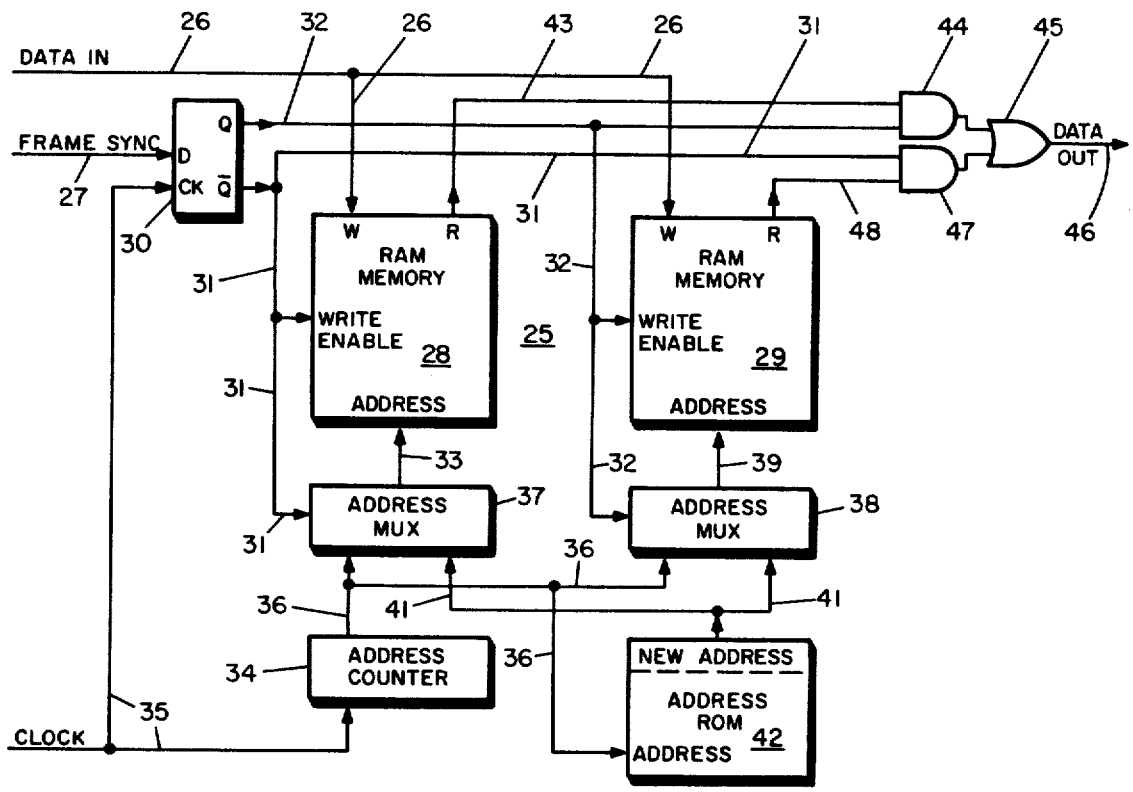
FIG. 3 is a block diagram showing a preferred embodiment buffer memory and address pointers employed in the interleaver and de-interleaver of the present invention.
FIG. 4 is a schematic table of an 8×8 memory array showing the address positions of data bits before permutation.
FIG. 5 is a schematic table of the 8×8 memory array of FIG. 4 showing the address positions of data bits after permutation.

Refer to FIG. 1 showing in block diagram a typical environmental application of the present invention. The data source 10 comprises any series form of data bits to be transmitted. The source of data bits are error correction encoded at block 11, which also includes means for recognizing the start of a block and generating a block start signal on line 12. The encoded stream of data bits is passed through the interleaver 13 and subsequently processed and transmitted by transmitter 14 on line 15 which may comprise an antenna or a channel 16. It will be noted that an air or line channel 16 is also referred to as a channel. The receive signals on line 18 have been subject to a burst of radio frequency interference signals as indicated by the input line 17. The receive signals are processed by receiver 19 and passed through de-interleaver 21 where they are error decoded in decoder 22 before being presented as an output to the data sink 23 or utilization device.

Refer now to FIG. 2 which shows in a schematic diagram form the effects of interleaving and de-interleaving. FIG. 2A represents a serial stream of sixty-four data bits numbered in the order of sequence in which they appear. Pulse 24 represents a high energy burst of radio frequency signals which is so strong as to effectively block out the data bits being presented at positions 25 through 40. Ordinarily, if the signals are not processed, the blocking out of twenty-five percent of the data in a block is effective to disrupt the transmission of communications data. FIG. 2B represents a reordering of the positions of the data bits of FIG. 2A employing bit rotation permutation as will be explained hereinafter with regards to FIG. 5. FIG. 2C illustrates the de-interleaved stream of data as it would appear leaving the de-interleaver 21 employing the afore-mentioned simple bit rotation permutation.

FIG. 2D represents a different form of interleaving which can be performed by interleaver 13 and is referred to hereinafter as dual orthogonal permutation. FIG. 2E illustrates the data stream which would be generated at the output of de-interleaver 21 when employing the preferred embodiment dual orthogonal permutation to be explained in detail hereinafter.

In FIG. 2B, the data bits which were interleaved starting with data bit 20 up to data bit 45 are completely blanked out. In the reordered sequence after de-interleaving, it is noted that eight pairs of bits have been blocked out or interferred with but are separated one from the other in a manner which permits error correction encoding and decoding to make allowance for these errors.

Refer again to FIG. 2D showing a different reordering or sequence of data bits in which the data bit starting with bit 23 and ending with the bit 43 are blanked out by the pulse 24.

After these interleaved data bits are de-interleaved and placed in their original order as an output of de-interleaver 21, it is noted that sixteen single error or bit ommissions are presented which are much easier to correct by standard error encoding and decoding means.

FIG. 2E has been presented to simplify the explanation of the present invention. The bit error distribution shown in the figure is substantially periodic. However, as the interference burst signal 24 becomes more repetitive the bit errors will be distributed in a more random or quasi-random pattern and such patterns are capable of being corrected by error correction encoding and decoding apparatus such as convolution encoding employed with Viterbi decoders.

FIG. 3 is a block diagram showing the structural elements employed in an interleaver and in a de-interleaver. The periodic and regular sequence of data bits appearing on the input data line 26 will be presented to both data or memory arrays 28 and 29 even though only one memory array will be effective to accept the data being presented on line 26 at any one time. The block or frame synchronization signal on line 27 is being presented to the D type flip-flop 30 so as to present a high output on either the Q or $\overline{Q}$ output lines 32 or 31 respectively. When the high output from $\overline{Q}$ is presented on line 31 to the write enable input of memory array 28, the series of signals being presented at the write line 26 to memory array 28 are sequentially read into the memory array 28 at the sequential addresses which are being presented at address pointer line 33. The addresses appearing at pointer line 33 are generated by address counter 34 which is being driven by clock signals on line 35 to cause addresses to appear on line 36 to the address multiplexer 37. When the $\overline{Q}$ signal from the flip-flop 30 is high on line 31, not only does it enable writing to memory array 28 but it sets the address multiplexer 37 so as to cause the sequential addresses from address counter 34 to appear on line 33. When the $\overline{Q}$ signal on line 31 is low so as to disable address multiplexer 37 and writing into memory array 28, there is a high Q signal on line 32 which enables the memory array 29 and the address multiplexer 38. The address counter 34 now presents via line 36 to address multiplexer 38 a sequence of addresses which are passed through multiplexer 38 and presented via line 39 to memory array 29. It will be understood that memory array 28 is having data bits stored in the memory 28 while memory array 29 is having data bits read out and vice versa. Thus, it will be understood that when the write enable line to memory array 28 or 29 is low or inactive, the memory array will be enabled for readng. Assume now that memory array 28 has a complete block of information stored therein as a result of data bits arriving on data line 26. After the memory is loaded the address multiplexer 37 is reset because the set line 31 is low, thus enabling the address line 41 from address ROM 42 at MUX 37. Even though the address pointer line 41 is active, the signal being presented at address multiplexer 38 is blocked because the address multiplexer is being set by line 32. The output or pointer addresses on line 41 are passed through address multiplexer 37 and presented as read out addresses to memory array 28 which causes the data bits in the address so designated to appear on data output line 43. The data bits on line 43 are applied to AND gate 44 which is held in the enabled position by the high signal from the Q output on line 32 causing the data bits being read from memory array 28 to appear at AND gate 44 and at OR gate 45 and on data output line 46. It will be understood that the address counter 34 is presenting a complete sequence of addresses on line 36 which are applied to address ROM 42 so that the new addresses on line 41 will completely read out all of the bit addresses in memory array 28 before flip-flop 30 changes state to reverse the afore-mentioned procedure in which data stored in memory array 29 will be read out through AND gate 47 and OR gate 45 on to data output line 46. While the information in memory array 29 is being read out, the data input on line 26 is being written into memory array 28.

It will be understood that the sequence of addresses from address counter 34 on line 36 are in a regular binary sequential order and that the new addresses that are being read out of the address ROM 42 are in a predetermined quasi-random sequence as will be explained hereinafter. Address ROM 42 may be a non-eraseable ROM or may be a programmed eraseable ROM as the case may be. The effect of address ROM 42 is to serve the purpose of a look up table. It is well known that a small computer or processor can be programmed to present look up table addresses, however, the speed with which the communication systems are to be operated makes it highly desirable to use an address ROM which operates in a few microseconds.

Refer now to FIG. 3 showing schematically in column and row array form the numbered bit positions for an $8 \times 8$ memory array. It will be understood that the memory arrays to be used in the present invention are preferably much larger than an $8 \times 8$ array and are usually defined as a $2^n$ by $2^n$ array where n is an interger. In a $64 \times 64$ array the value of n would equal six.

In the preferred embodiment reordering or permutation, the amount of bit rotation within a column-row or the value of a new column-row position (NP) is equal to a number defined by the old position (OP) plus one time one-half of the old position. Thus, $NP = (OP/2)(OP+1)$. The old positions start with zero and are numbered up to N-1, thus, in the $8 \times 8$ array of FIG. 4, the old positions of zero, one, two, three, four, five, six, seven produce bit rotations of, or new column-row positions of zero, one, three, six, two, seven, five and four respectively. It will be understood that in applying the permutation formula the resultant new position number must be reduced to modulo N.

Refer now to FIG. 5 showing in schematic array form the new position of the data bits after being rotated. In FIG. 5 the individual bits are rotated according to the above-mentioned permutation within columns. Thus, in the zero column of FIG. 4 the bits are not rotated. In the first column of FIG. 4 the bits in column one of FIG. 5 are rotated one position, thus, the number two bit which appear in the zero row has been rotated one bit position and now appears is row one. It will be understood that all of the other bits in column one of FIG. 5 are changed one position (rotated one bit position) according to the permutation desired. Similarly, the bits in column two have been rotated three bit positions, thus, the number three bit which appeared in row zero of column two now appears in row three of column two in FIG. 5. Similarly, all of the other bit positions in column two of FIG. 5 are rotated three bit positions. The third column of FIG. 5 has the bit positions rotated six bit positions or down six rows. The bit positions of column five have their bits rotated seven positions. The bit positions in column six have their bits rotated five positions and the bits in column seven of FIG. 5 have their bits rotated four positions. It will be understood that the terminology being applied herein using rows and columns are interchangeable so far as the application of the novel permutation is applied.

Refer now to FIG. 6A showing an implementation of column rotation employing the above-mentioned permutation. To apply the permutation to the column rotation, the complete column is taken from its old position and placed in a new position. Using the above-mentioned permutation, the column zero remains in the zero column position and the column one remains in the one column position. However, the two, three and four column positions now appear in the three, six and two column positions and similarly, the old five, six and seven column positions now appear in the seven, five and four column positions. Having performed this permutation of rotation of columns we may now apply the bit rotation to the columns as explained with reference to FIG. 5. Applying the same permutation to rotation of bits within columns the change from FIG. 6A to FIG. 6B shows the result of the bit rotation of the array after having performed on it the column rotation. It will be noted that the rotation of columns and rotation of bits may be referred to as dual orthogonal permutation. By performing dual orthogonal permutation the distribution of the bits within columns or rows more closely approaches a quasi-random distribution than was heretofore performed with prior art row-column interleavers.

Having explained how the permutation and reordering of bits has been derived for FIGS. 5 and 6B it will be appreciated that the afore-mentioned distribution pattern shown in FIG. 2B and FIG. 2D are representative of FIGS. 5 and FIG. 6B respectively.

Refer now to FIG. 7A which is a schematic array in column and row form in which the preferred embodiment permutation has been first applied by bit rotation in FIG. 7A and then the same permutation has been applied in the orthogonal direction using bit rotation to achieve the distribution shown in FIG. 7B. Using the above-mentioned permutation the zero column bits are not rotated. The bits in column one are now rotated in the up direction row (bit) position and the bits in the two columns four, five, six and seven are respectively rotated in the up direction six, two, seven, five and four bit positions as explained hereinbefore. It will be noted that the bits shown in FIG. 7B have been rotated from the position shown in 7A according to the above-mentioned permutation. For example, the bits in the zero row are not rotated but the bits in the number one row are rotated from left to right by one bit position. Similarly, the bits in rows two, three and four are rotated from left to right by three, six and two bit positions respectively. Similarly, the bits in rows five, six and seven are rotated from left to right by seven, five and four bit positions respectively. The bit positions of the columns of FIG. 5 were rotated down using the above-mentioned permutation and the bit positions of the columns in FIG. 7A have been rotated up using the above-mentioned permutation. As long as the above-mentioned permutation is done in accordance with the preferred permutation, it does not change the desired distribution whether the rotation is made up or down or right to left.

FIGS. 5 to 7 show in array form the desired bit positions after being rotated according to the desired permutation. In order to achieve the desired results described hereinbefore, it is necessary to read the sequence of bits out by reading the columns from top to bottom and from left to right as would be done in a row-column interleaver. It will also be noted that the schematic representation shown in FIG. 2D may be produced by reading the columns zero through seven from top to bottom. That is column zero reads one, nine, seventeen, etc. through to bit fifty-seven and column one starts with bit fifty-eight and ends with bit fifty. Thus, it will be understood that the address ROM 42 shown in FIG. 3 is preprogrammed to be interregated by the sequential addresses from address counter 34 appearing on line 36 and will produce new addresses on output line 41 in the desired column by column sequence read out which was discussed hereinbefore with regards to FIGS. 5 to 7. The address ROM 42 acts as a high speed look up table to define the addresses desired on output line 41.

Figure 8:
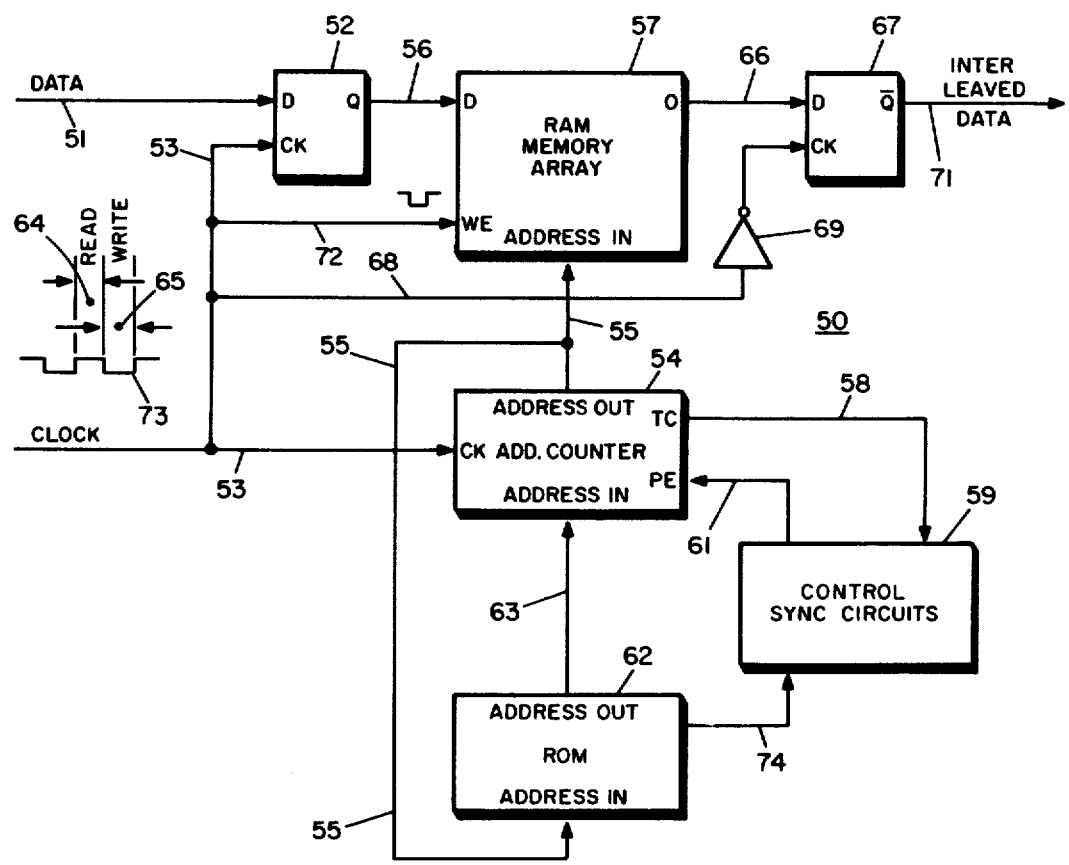
FIG. 8 is a block diagram showing another preferred embodiment interleaver and de-interleaver.

FIG. 8 is a block diagram of another preferred embodiment interleaver and de-interleaver. Data being supplied the interleaver 50 is encoded data being presented on line 51 which is clocked into flip-flop 52 by clock pulses on line 53. When acting as an interleaver 50, the sequence of operations is similar to that explained with regards to FIG. 3 in that there is one block time delay required before the information written into memory is read out. However, the present embodiment interleaver and de-interleaver requires only half the amount of RAM memory as required in the embodiment shown in FIG. 3. Assume that the twelve bit address counter 54 has produced the proper sequence of addresses on line 55 and that data appearing on line 56 to the RAM memory array 57 has been stored by rows as explained hereinbefore with regard to FIG. 4.

When the first block of information is loaded into memory 57, a terminal or end condition signal is produced on line 58 which is applied to control means 59. Control means 59 responds with a parallel entry signal on line 61 which instructs the address counter 54 to take its addresses from ROM 62.

After the first block of information is loaded in linear fashion into the memory 57, the second block of information is written or loaded in memory 57 in random fashion as the first block of information is being read out of memory 57.

Thus, for example, when applying the random sequence of addresses as shown in FIG. 6B, the ROM 62 produces the quasi-random sequence one, nine, seventeen, etc. to address memory 57 as shown in column zero and proceeds through the columns one through seven reading the sequence from top to bottom as shown in FIG. 6B. As each additional address location is presented on line 55 to memory 57, the next sequential address is being presented on line 63 to address counter 54.

To perform the read out and read in sequentially during each of the bit times, the clock pulses on line 53 are divided into a high level or read portion 64 and a low level or write portion 65.

During the read portion 64 of a bit time, the data at the address location on line 55 is read out on line 66 and stored in flip-flop 67 at the end of the read period 64. At the end of the read period 64 the clock signal is producing a negative going edge pulse on line 68 which is inverted at inverter 69 and appears as a positive clock pulse input at the clock side of flip-flop 67 causing the data to be presented on output line 71.

While the same address on line 55 is being presented to memory 57, the data on line 56 is written into memory 57 during the write portion 65 of the same bit time. The write portion of the data bit time 65 is a low signal which is presented on line 72 to the write enable input of memory 57, thus permitting the data present on line 56 to be written into the same memory address being presented on line 55. For example, referring to FIG. 6B and FIG. 8, when the address on line 55 is pointing to the address location one, the address location one as an input to ROM 62 produces the next address or address nine as the output on line 63. When the end of the bit time occurs and the positive going edge of the data bit time as shown at point 73 occurs, the address input on line 63 to the counter 54 is stored in the buffer of counter 54 and also presented as an output on line 55. After the data on line 56 is written into the last address location 29, at the end of the block, an end of block signal is produced on line 74 which causes the control means 59 to disable the parallel entry signal which was present on line 61 thus disabling the parallel entry from the ROM from the next block of information to be presented.

It will now be understood that the information is located in quasi-random form in memory 57 and that when the address counter 54 addresses the memory 57 in the afore-mentioned sequential form that the information being produced on line 66 is going to be in quasi-random form in the manner in which it was identified with regard to FIG. 6B. At the end of this block a new end of block signal is produced on line 58 which causes the control means 59 to again produce the parallel entry signal on line 61 which causes the next block of information to be identified by the ROM 62. Having explained how the interleaver operates with regard to every other block of information, it will be understood that only one memory array 57 is required using the FIG. 8 embodiment whereas the FIG. 3 embodiment required two memory arrays.

When the FIG. 8 embodiment is operating as a de-interleaver 50, it is assumed that the encoded data is appearing on line 51 and that the control means 59 has locked on to the block sync signals. Thus, control means 59 also recognizes when the de-interleaver 50 is in the linear or sequential mode or is in the quasi-random mode. During the linear or sequential mode the address counter 54 is producing the sequential addresses on line 55 and during the quasi-random mode, the addresses are being produced by the ROM 62 on line 63 and are delayed one count and then presented on line 55 to the RAM memory 57 of the de-interleaver. Thus, it is understood that the interleaver and de-interleaver are operating in exactly identical modes as far as the sequence of operations and clock pulses are concerned.

Having explained a preferred embodiment and modified embodiment apparatus capable of operating as either an interleaver or de-interleaver, it will now be understood that the structure 25 and 50 shown in FIGS. 3 and 8 are adapted to be substituted into the system shown in FIG. 1 for the interleaver 13 or the de-interleaver 21.

The schematic tables shown in FIGS. 4 to 7 are not actual memory locations, but were designed to illustrate the sequence of addresses in the order in which there are accessed in memory. The final sequence of addresses are shown in FIG. 2 illustrating the effectiveness of rotation to achieve a quasi-random sequence of addresses. In actual practice the memory arrays used are much larger than an 8×8 array.

We claim:

1. A data transmitting system of the type having an interleaver for changing the order of data bits in a data stream to be transmitted comprising:
   a data source for providing a stream of data bits to be transmitted,
   interleaver means coupled to said stream of data bits,
   transmitter means coupled to said interleaver means for transmitting said data bits in a quasi-random pattern sequence, said interleaver means comprising buffer memory means for storing a block of said stream of said data bits in a predetermined sequential pattern of memory addresses, said addresses being definable in terms of an array of columns and rows, first address pointer means coupled to said buffer memory means for generating said predetermined pattern of memory addresses and for storing said data bits in said buffer memory means in rows, second address pointer means coupled to said buffer memory means for generating a predetermined quasi-random pattern of memory addresses and for reading said stored data bits out of said buffer memory means by columns, said predetermined quasi-random pattern of memory addresses being generated by a predetermined rotation of bits within columns, and control means coupled to said buffer memory means and said first and second pointer means for alternately storing said stream of data bits into said buffer memory means as rows of data bits and for reading said stored data bits out of said buffer memory means as columns of data bits in a predetermined quasi-random stream of data bits.

2. A data transmitting system as set forth in claim 1 which further includes generating said predetermined quasi-random pattern of memory addresses by further rotating said bits within rows.

3. A data transmitting system as set forth in claim 1 which further includes generating said predetermined quasi-random pattern of memory addresses by first rotating the order of said columns in said array.

4. A data transmitting system as set forth in claim 2 wherein the rotation of bits is a permutation in which the new position is equal to the old position plus one multiplied by one-half of the old position.

5. A data transmitting system as set forth in claim 3 wherein the rotation of columns is a permutation in which the new position is equal to the old position plus one multiplied by one-half of the old position.

6. A data transmitting system of the type set forth in claim 1 which comprises a forward error correction encoder coupled between said data source and said interleaver.

7. A data transmitting system of the type set forth in claim 6 which further includes;

receiving means for receiving said transmitted quasi-random stream of data bits, de-interleaver means coupled to said receiving means for generating said stream of data bits in the same order as generated by said data source, and forward error correction decoding means coupled to said de-interleaving means coupled to said de-interleaving means for correcting bit errors in said stream of data bits introduced by a burst of high energy interference signals.

8. A data transmitting system of the type set forth in claim 1 wherein buffer memory means comprise a random access memory.

9. A data transmitting system of the type set forth in claim 8 wherein said first and second address pointers comprise a counter and a read only memory.

10. A data transmitting system of the type set forth in claim 9 wherein said counter is adapted to supply the same address to said random access memory and to said read only memory.

11. A data transmitting system of the type set forth in claim 10 wherein said read only memory is adapted to supply an address to said counter.

* * * * *